United States Patent
Matsubara

[11] Patent Number: 5,918,036
[45] Date of Patent: Jun. 29, 1999

[54] SIMULATION METHOD OF SILICIDE REACTION FOR USE WITH PRODUCTION OF SEMICONDUCTOR DEVICES

[75] Inventor: Yoshihisa Matsubara, Tokyo, Japan

[73] Assignee: NEC Corporation, Tokyo, Japan

[21] Appl. No.: 08/855,565

[22] Filed: May 13, 1997

[30]    Foreign Application Priority Data

May 30, 1996    [JP]    Japan ................................. 8-136677

[51] Int. Cl.⁶ .................................................. G06F 9/455
[52] U.S. Cl. ............................................................. 395/500
[58] Field of Search ........................... 395/500; 364/578; 228/124.1, 124.5

[56]              References Cited

U.S. PATENT DOCUMENTS 5,161,728    11/1992    Li ........................................... 228/124.1

OTHER PUBLICATIONS

Modeling of Local Reduction in TiSi2 and CoSi2 Growth Near Spacers in MOS Technologies: Influence of Mechanical Stress and Main Diffusing Species Fornara and Poncet, May 1996, pp. 73–76.

Grid Adaptation Near Moving Boundaries in Two Dimensions For IC Process Simulation Law, Oct., 1995, pp. 1223–1230.

Technology Limitations For N+/P+ Polycide Gate CMOS Due to Lateral Dopant Diffusion in Silicide/Polysilicon Layers Chu et al., Jun., 1991.

Crandle, et al. "A Two–Dimensional Process Model for Silicide Growth", International Workshop on VLSI Process and Device Modeling, 1993, pp. 68–69.

*Primary Examiner*—Kevin J. Teska
*Assistant Examiner*—Dan Fiul
*Attorney, Agent, or Firm*—Whitham, Curtis & Whitham

[57]              ABSTRACT

The invention provides a simulation method of a silicide reaction for use with production of semiconductor devices which sufficiently verifies production of silicide of a high resistance value. In the simulation method, a high melting point metal having a first film thickness is attached to a silicon layer having a first width and heat treatment of the high melting point metal and the silicon layer is performed, and then, a minimum value of the first width with which a silicide reaction of the high melting point metal is not suppressed. Thereafter, a yield strength of the high melting point metal with the first film thickness is calculated, and then, and a silicide reaction force at an interface between the high melting point metal and the silicon is calculated from the yield strength and the minimum value of the first width. Finally, when the silicide reaction force is higher than the yield strength, a diffusion equation is solved, but when the silicide reaction force is lower than the yield strength, it is discriminated that sufficient silicification is not performed.

6 Claims, 6 Drawing Sheets

SIMULATION METHOD OF SILICIDE REACTION FOR USE WITH PRODUCTION OF SEMICONDUCTOR DEVICES

BACKGROUND OF THE INVENTION

1. Field of the Invention

This invention relates to a simulation method of a silicide reaction for use with production of semiconductor device, and more particularly to a simulation method for setting conditions when a silicide film of a metal having a high melting point is formed on a diffused layer in source/drain regions and so forth or on gate electrodes of MOS transistors.

2. Description of the Related Art

Refinement and Increase in density of semiconductor devices or integrated circuit devices have been and are being proceeded energetically, and at present, semiconductor devices of a very high integration degree such as memories and logic elements designed with a dimensional reference of 0.15 to 0.25 microns are produced.

As the degree of integration of semiconductor devices increases in this manner, it becomes important to reduce the dimensions in width of a diffused layer in source/drain regions and so forth and in width of gate electrodes and reduce the film thickness of a material which forms semiconductor devices.

On the other hand, reduction of the width of gate electrodes or of gate electrode wirings and the thickness of the gate electrode material inevitably gives rise to increase the wiring resistances of them and thus has a significant influence on the delay of the circuit operation. Therefore, for refined semiconductor devices, a technique for reduction in resistance of the gate electrodes for which high melting point metal silicide is used cannot be avoided. Particularly, a self-align-silicide (salicide) technique which uses titanium as a high melting point metal is an important technique for fine MOS transistors.

Here, a conventional method of manufacturing a MOS transistor having a salicide structure is described with reference to FIGS. 6(a) to (e).

First, an element separating insulation film 602 is formed in a region of a surface of a silicon substrate 601, on which no MOS transistor is to be formed later, as shown in FIG. 6(a) using a known LOCOS technique. Then, ion implantation of an impurity for a channel stopper is performed with the same conduction type as that of the silicon substrate 601 on the surface of the silicon substrate 601 under the element separating insulation film 602. Thereafter, the exposed surface of the silicon is thermally oxidized to form a gate insulation film over the entire area.

Then, a polycrystalline silicon film of approximately 150 nm thick is formed over the entire area by a chemical vapor phase deposition method (CVD), and an impurity such as phosphor is doped. Thereafter, the polycrystalline silicon film and the gate insulation film are selectively removed using a lithography technique and a dry etching method to form a gate insulation film 603 and a gate electrode 604 of a desired shape. Thereafter, a silicon oxide film is deposited over the entire area using a chemical vapor phase deposition method (CVD), and a spacer 605 of the silicon oxide film is left only on side faces of the gate insulation film 603 and the gate electrode 604 by anisotropic dry etching.

After a gate electrode structure is produced in this manner, diffusion of an impurity of arsenic or boron is performed by heat treatment at 800° C. to 1,000° C. to form a diffused layer 606 for a source region, a drain region and so forth. Here, where the MOS transistor to be produced is of the N-channel type, arsenic is selected as the impurity, but where the MOS transistor is of the P-type, boron is selected as the impurity.

Then, a titanium film 607 of approximately 50 nm thick is formed over the entire area by a metal sputtering method or the like as shown in FIG. 6(b). Then, heat treatment is performed for 30 to 60 seconds in a nitrogen atmosphere of an atmospheric pressure. This heat temperature is normally performed by a lamp annealing apparatus, and the heat treatment temperature is set to 600° C. to 650° C. Silicification of the titanium is performed in this manner. As a result of such heat treatment, such a structure as shown in FIG. 6(c) is obtained. Referring to FIG. 6(c), on the surface of the gate electrode 604 of the polycrystalline silicon film and the diffused layer 606 in the source/drain region and so forth, a silicide layer 609 of a C49 structure which is a crystal structure, having a high electrical resistivity, is formed in a contacting relationship with them, and a titanium nitride layer 608 is formed on the silicide layer 609. In contrast, the titanium nitride layer 608 is formed in a contacting relationship on the element separating insulation film 602 in the form of a silicon oxide film and the spacer 605 over the entire area.

Then, the titanium nitride layer 608 is removed as shown in FIG. 6(d) using an ammonia solution and a solution obtained by mixing pure water into a hydrogen peroxide solution. As a result of this step, the silicide layer 609 of the C49 structure is left in a self-aligned relationship only on the gate electrode 604 and the diffused layer 606 in the source/drain region and so forth.

Further, second heat treatment is performed for approximately 60 seconds in a nitrogen atmosphere of an atmospheric pressure. Also this heat treatment is performed by lamp annealing, and the processing temperature is set to approximately 850° C. As a result of this heat treatment, the silicide layer 609 of the C49 structure changes to a silicide layer 610 of the C54 structure which is a crystal structure having a low electrical resistivity as shown in FIG. 6(e). A wiring layer of aluminum or some other metal is formed on the silicide layer 610 of the C54 structure to form an electric circuit.

However, as the refinement and the increase in density of devices increase, refinement of the gate electrode 604, the diffused layer 606 in the source/drain region and so forth in each of MOS insulated gate field effect transistors formed in this manner proceeds so that the widths of them are very narrow. As reduction in width proceeds in this manner, it becomes difficult to form a silicide layer of a low electrical resistivity on them. In particular, if the contacting region is small, then a sufficient amount of silicon cannot be supplied and the procedure of a silicification reaction is suppressed, and consequently, sufficient silicide is not formed. Even if sufficient silicide is formed, the electrical resistivity cannot still be reduced sufficiently.

Therefore, prior to high density formation of fine MOS insulated gate field effect transistors, it must be confirmed in the stage of designing whether or not a region (particularly in terms of the width) in which a silicide film having a sufficient electrical resistivity can be formed has been assured. In such confirmation, optimum conditions must be found out taking not only the widths of the gate electrode 604, the diffused layer 606 in the source/drain region and so forth but also various conditions in the silicide formation steps such as the film thickness of the high melting point metal such as titanium and the heat treatment temperature, heat treatment time and so forth in the heat treatment, the impurity surface concentrations of the gate electrode 604 and the diffused layer 606 and so forth into consideration. Those optimum conditions can be determined readily if a two-dimensional process simulation technique in which a silicide formation process which can be applied to a process of producing fine MOS field effect transistors is established.

Several proposals have been made for such a two-dimensional process simulation technique as described above. One of the techniques is disclosed in a report by C. M. Li, T. Crandle, M. Temkin and P. Hopper, "A Two-Dimensional Process Model for Silicide Growth", International Workshop on VLSI Process and Device Modeling, 1993, pp. 68–69. In this technique, a silicide formation process is analyzed using a diffusion efficiency.

Subsequently, this technique is described with reference to FIG. 5. First, for a heat treatment step for formation of silicide, a heat treatment temperature and a heat treatment time are set (step 301).

Then, diffusion equations for silicon and metal atoms in silicide are solved (step 302). According to the prior art technique, diffusion of silicon and metal atoms in silicide is described using a point defect diffusion process. A time function of the concentration $C_i$ of silicon or metal atoms can be obtained by solving the following diffusion equation (1):

$$\frac{\partial C_i}{\partial T} = \nabla(D \cdot \nabla C_i) - R \qquad (1)$$

where D is the diffusion coefficient, and R the recombination frequency of silicon and metal. From a solution of the equation, a concentration of the silicide at each position is obtained.

Thereafter, a diffusion rate at the interface between silicon and silicide (step 303) and a diffusion rate at the interface between metal and silicide (step 304) are calculated. The diffusion rates at the interfaces (that is, the growth rates) are calculated by the same calculation, and the diffusion rate (growth rate) at the ith point of each of the interfaces is calculated in accordance with the following expression (2):

$$\frac{d X_i}{d t} = \frac{k_i C_i n_i}{N_i} \qquad (2)$$

where $k_i$ is the reaction rate coefficient at the interface, $N_i$ the number of metal or silicon atoms consumed per unit silicide amount, $C_i$ the concentration of metal or silicon atoms on the silicide side of the interface, and $n_i$ a vector normal to the interface.

Subsequently, it must be taken into consideration whether the two interfaces including the interface between metal and silicide and the interface between silicide and silicon are same as or different from each other. In order to solve the diffusion equation in this instance, the following procedure must be followed. First, from the growth rate of the silicide, the moving speeds of the interface between silicon and silicide and the interface between metal and silicide are calculated, and the interfaces are moved in accordance with the moving speeds for a very short period of time (step 305). In this stage, visco-elasticity calculation is performed and the profiles of the interfaces are deformed. Then, using the results as boundary conditions, an impurity distribution of the bulk (silicon) is calculated by solving the diffusion equation (step 306).

By the foregoing steps, a state at a certain point of time is made clear. The proceeding situation of the diffusion can be obtained by repetitively performing the calculation after the time is advanced (step 307).

According to the solving method which uses the phenomenalistic diffusion equation of C. M. Li et al. described above, the diffusion equation for an impurity concentration is solved using the interface between metal and silicide and the interface between silicide and silicon as boundary conditions, and then, those interfaces are moved in accordance with the growth rate of silicide calculated separately from the impurity distribution. In this solution, the mutual dependency of the silicide formation and the impurity distribution is taken into consideration but merely in a phenomenalistic sense in the form of an impurity flux and a deformation flux in the interface caused by the movement of the interface. Therefore, the prior art solving method described above fails to represent a phenomenon that, where the width is small, a silicide reaction is suppressed from the fact that plastic deformation of a high melting point metal film described below is not taken into consideration.

In particular, the prior art solving method does not take the phenomenon into consideration that a silicide film itself sinks into silicon as a silicide reaction proceeds. This phenomenon arises from silicon diffusion originating from the silicide reaction. Particularly in a silicon region surrounded by an insulating substance, if sinking of the silicide film proceeds, then plastic deformation of the high melting point metal film occurs as the silicide is deformed. In this instance, where the silicon region has a small width, since the length of the span over which the silicide is supported on the insulation film is short, the force necessary for plastic deformation of the high melting point metal increases. As a result of the increase of the material strength of the high melting point metal film, diffusion of the high melting point metal film is suppressed, and consequently, the rate of the silicide reaction drops. In this manner, where the silicon region is a region having a small width, particularly the reduction of the rate of the silicide reaction matters, and even if a metal wiring of aluminum or a like metal is formed on the silicide region, sufficient connection cannot be established with a low resistance.

In this manner, the prior art solving method which uses the phenomenalistic diffusion equation has a problem in that a silicide reaction from a point of view of the strength of materials of a high melting point metal is not taken into consideration. Consequently, the phenomenon that a drop of the reaction rate of silicification occurs with a wiring of a small width originating from the film strength of the high melting point metal film is not represented, and as a result, the prior art solving method is disadvantageous in that simulation of the phenomenon that silicide of a low resistivity cannot be formed in a narrow wire region cannot be achieved. In other words, the simulation fails to obtain a pointer to a limitation in refinement which is most important in development of semiconductor devices. Consequently, the prior art solving method exhibits a contradiction that, although silicide is formed according to the prior art solving method which uses the phenomenalistic diffusion equation, in actual manufacture of semiconductor devices, sufficient silicification is not achieved.

SUMMARY OF THE INVENTION

It is an object of the present invention to provide a simulation method of a silicide reaction for use with production of semiconductor devices which sufficiently verifies production of silicide of a high resistance value.

In order to attain the object described above, according to the present invention, there is provided a simulation method of a silicide reaction for use for production of semiconductor devices, comprising the first step of attaching a high melting point metal having a first film thickness to a silicon layer having a first width, heat treating the high melting point metal and the silicon layer and detecting a minimum value of the first width with which a silicide reaction of the high melting point metal is not suppressed, the second step of calculating a yield strength of the high melting point metal with the first film thickness and calculating a silicide reaction force at an interface between the high melting point metal and the silicon from the yield strength and the minimum value of the first width, and the third step of solving, when the silicide reaction force is higher than the yield strength, a diffusion equation but determining, when the silicide reaction force is lower than the yield strength, that sufficient silicification is not performed.

In the simulation method of a silicide reaction for use for production of semiconductor devices, a point of view of the strength of materials is added to a silicide reaction process, and particularly, a limitation in strength of materials of a high melting point metal film is applied to the reaction at the interface between the high melting point metal such as titanium and silicon in an initial stage of the silicide reaction. As a result, a limit to refinement of a silicide process which is most important in development of fine semiconductor devices can be discriminated.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENTS

In the present invention, prior to production of fine semiconductor devices, it is confirmed whether or not sufficient silicide can be formed based on the area or width of a silicide formation region, the impurity concentration, heat treatment conditions and so forth, or various production conditions are determined.

While titanium, molybdenum and so forth can be used for the high melting point metal, titanium is used in preferred embodiments of the present invention described below.

Figure 1:
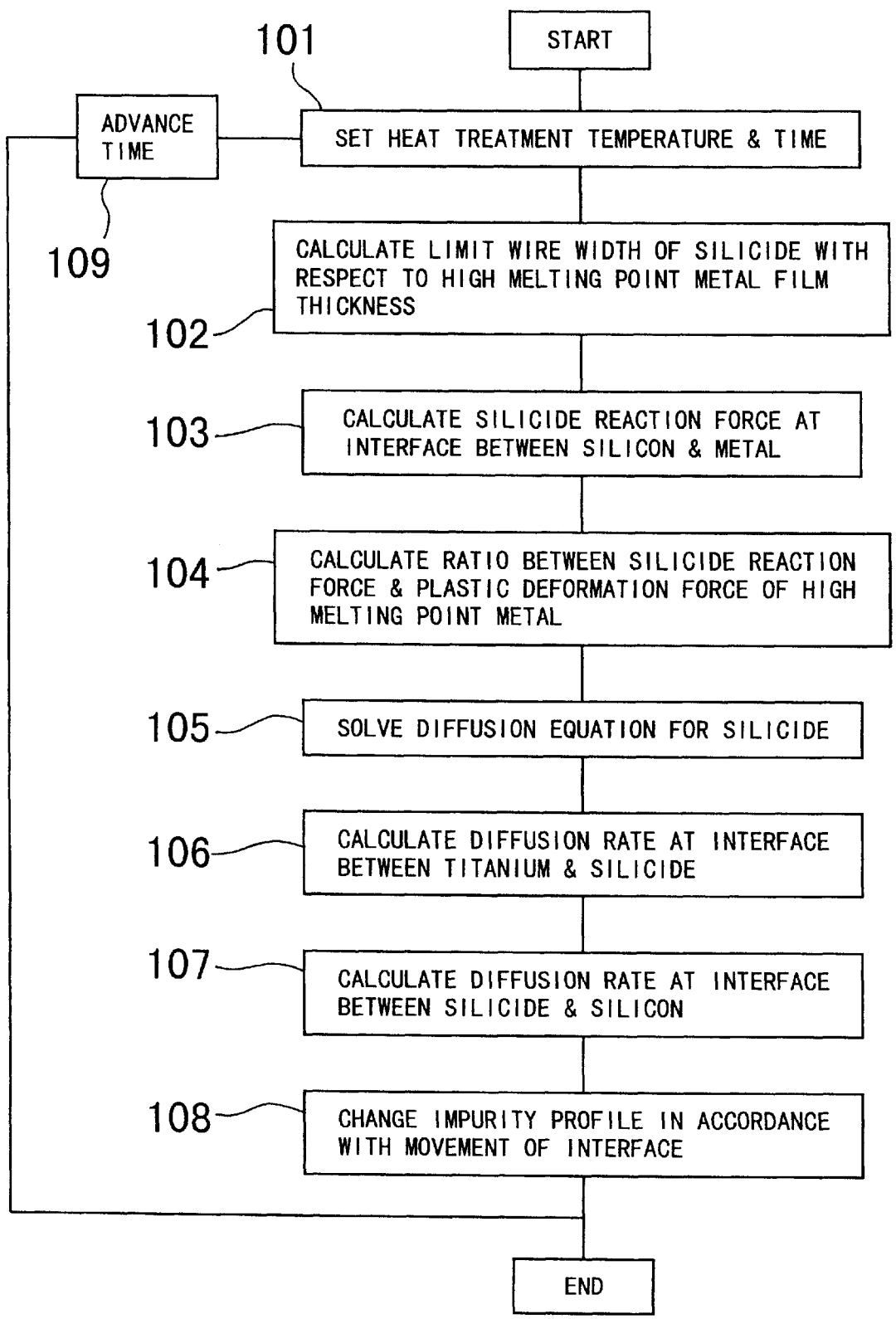
FIG. 1 is a flow chart illustrating a simulation method of a silicide reaction for use with production of semiconductor devices according to the present invention.

Referring first to FIG. 1, there is illustrated in a flow chart a simulation method of a silicide reaction for use with production of semiconductor devices according to the present invention. In the first simulation method, titanium silicide is attached to silicon, and a diffusion equation for solving a silicide reaction rate is weighted using an expression of the strength of materials and silicide is formed in a self-aligned relationship in a silicon region of a predetermined shape.

First, a heat treatment temperature and a heat treatment time are set corresponding to a heat treatment step for formation of silicide (step 101).

Then, two moving boundaries including the interface between metal and silicide and the interface between silicide and silicon must be taken into consideration. In the method of the present embodiment, it is discriminated prior to this whether or not a silicide reaction is possible. In particular, in steps 102, 103 and 104, the moving velocities of the interface between metal and silicide and the interface between silicide and silicon are calculated, and then, it is discriminated based on the moving velocities whether or not a silicide reaction may be permitted before the processing of moving the interfaces for a very short period of time.

For the determination of whether or not a silicide reaction is permitted in the present embodiment, a single beam model of the metal strength at the interface between metal and silicon in an initial stage of the reaction. In this single beam model, a stress necessary for deformation of the titanium film is calculated regarding the force of a reaction of silicide as a "load", and the maximum bending stress in this instance is calculated from the following expression (3):

$$\delta max = 3Pl/2h^2 \qquad (3)$$

where l is the span length, and h is the metal film thickness.

Figure 2:
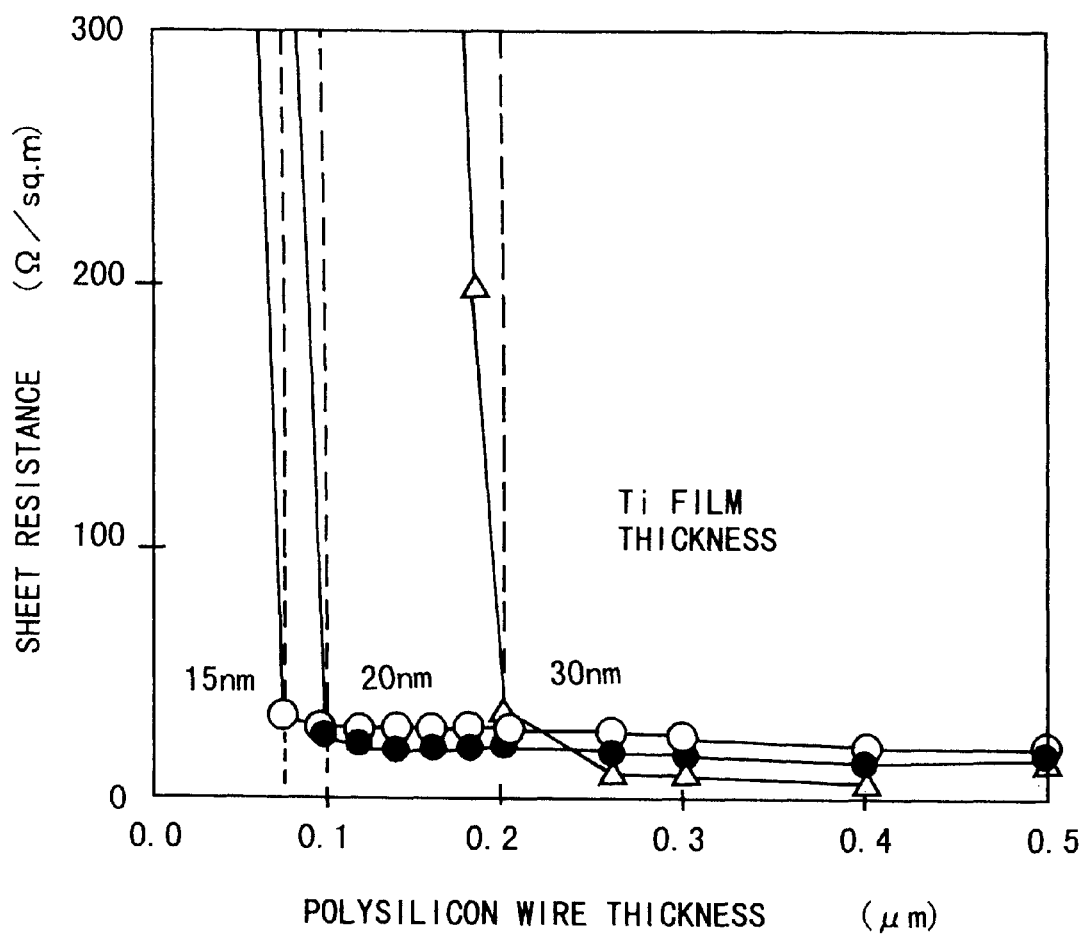
FIG. 2 is a graph showing actually measured values of the titanium film thickness dependency of the silicide layer resistance of semiconductor devices produced based on a result of the simulation by the simulation method of FIG. 1.

A model which is applied, using the maximum bending stress thus calculated, to a case wherein two supporting points are involved and in which a load is applied to a point at distances equal from the two supporting points A and B. Assuming that a silicide reaction requires plastic deformation of titanium, the silicide reaction force P acting as a load is calculated from the titanium film thickness dependency of the limit wire width. It is to be noted that the "limit wire width" signifies a limit width with which silicide of a low resistivity is obtained when the wire width is reduced. Then, the limit wire width of titanium of a predetermined film thickness is calculated from such a result of an experiment of the wire width dependency of the layer resistance as shown in FIG. 2 (step 102). Further, from the expression (3) above, $4\times10^2$ dyncm$^{-2}$ is obtained as the silicide reaction force assuming that the yield strength of titanium is $1.4\times10^9$ dyncm$^{-2}$ (step 103). The reaction force and the plastic deformation force are compared with each other. If the reaction force exceeds the plastic deformation force, then the titanium film can be plastically deformed and a silicide reaction proceeds. On the contrary, if the plastic deformation force in the step exceeds and the titanium film cannot be plastically deformed, then a vacancy is produced in the interface between silicon and titanium and the reaction is stopped by the vacancy (step 104). This limit condition is added as a weight function to the diffusion coefficient of the diffusion equation. By solving the diffusion equation of the following expression (4) obtained in this manner, the time function of the concentration $C_i$ of titanium atoms is obtained:

$$\frac{\partial C_i}{\partial t} = \nabla(D(A) \cdot \nabla C_i) - R \quad (4)$$

where A is the weight function for discrimination of whether or not plastic deformation is possible.

Thereafter, similarly as in the prior art method described hereinabove, the growth velocities at the ith points of the interfaces between titanium and silicide (step 106) and between silicon and silicide (step 107) are calculated in accordance with the following expression (5):

$$\frac{dX_i}{dt} = \frac{k_i C_i n_i}{N_i} \quad (5)$$

In this manner, from the growth method of silicide, the moving velocities of the interfaces between titanium and silicide and between silicide and silicon are calculated, and the interfaces are moved for a short time in accordance with the moving velocities. In this stage, visco-elasticity calculation is performed and the interfaces are deformed in profile.

Subsequently, using this result as a boundary condition, the impurity distribution in the bulk is calculated by solving the diffusion equation (step 108).

The steps described above are repeated every time after a very short time is advanced (step 109).

Figure 3:
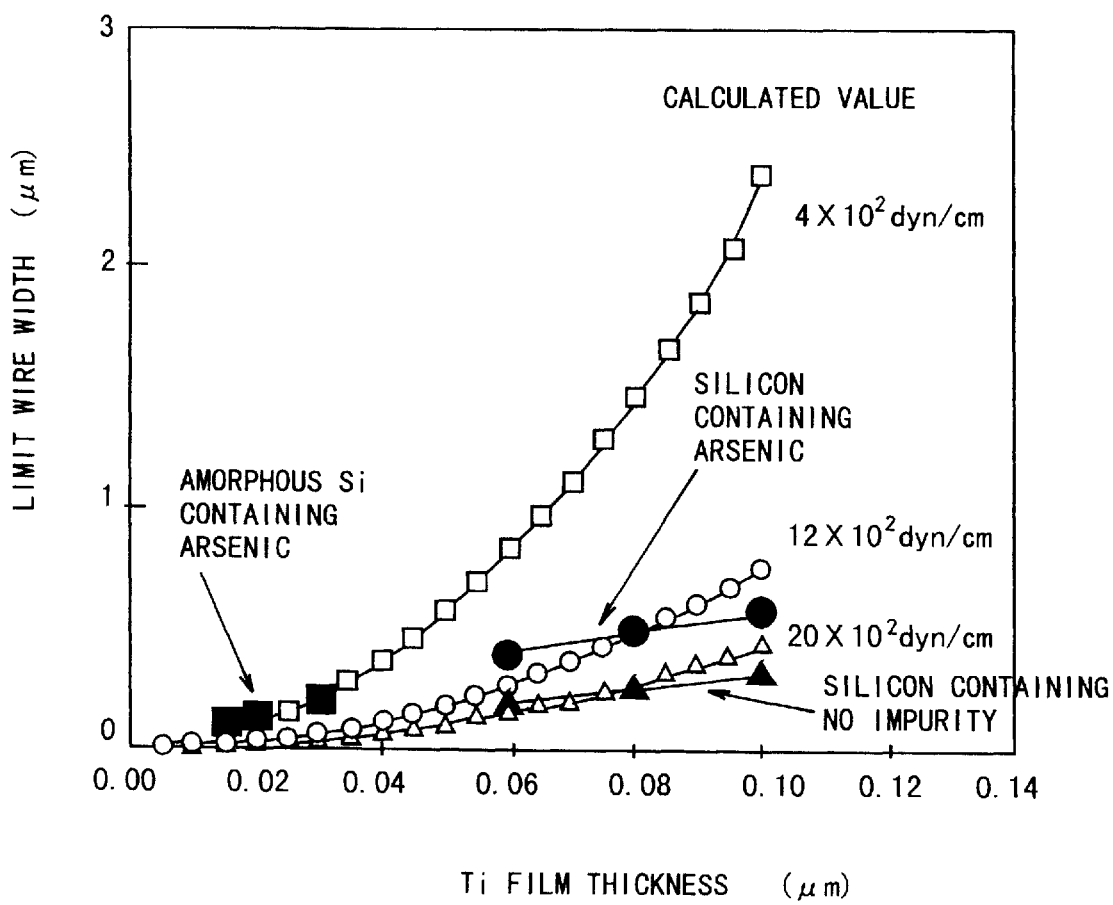
FIG. 3 is a graph illustrating comparison between calculated values and actually measured values of the titanium film thickness redundancy of the silicide limit wire width calculated by strength calculation based on the simulation method of FIG. 1.

FIG. 3 illustrates a result of comparison between limit wire widths calculated based on the method of the present embodiment and limit wire widths obtained by an experiment. As seen from FIG. 3, the limit wire widths calculated based on the method of the present embodiment exhibit a high degree of coincidence with the experiment values irrespective of the impurity concentration or the titanium film thickness.

Figure 4:
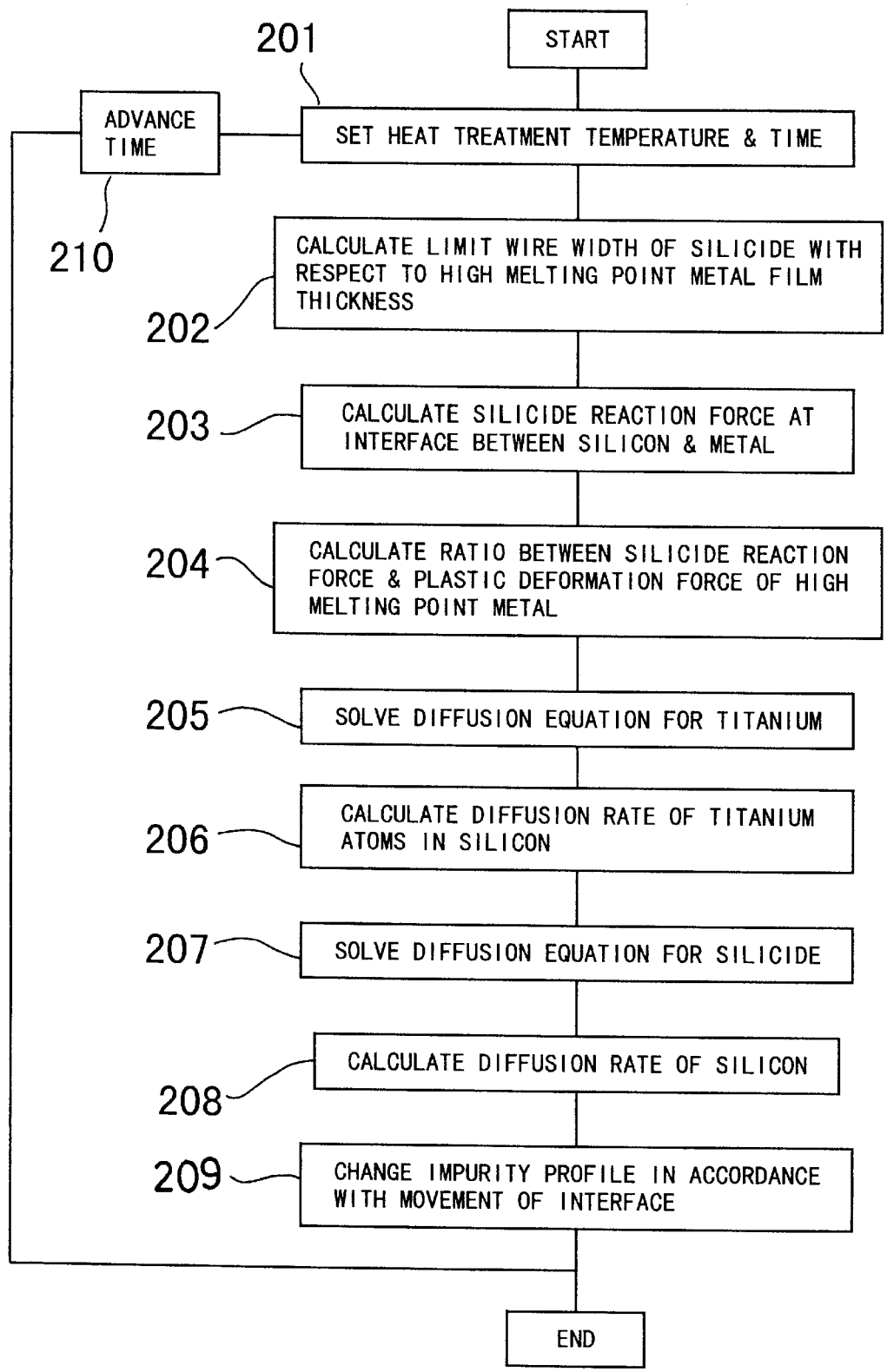
FIG. 4 is a flow chart illustrating another simulation method of a silicide reaction for use with production of semiconductor devices according to the present invention.
Figure 5:
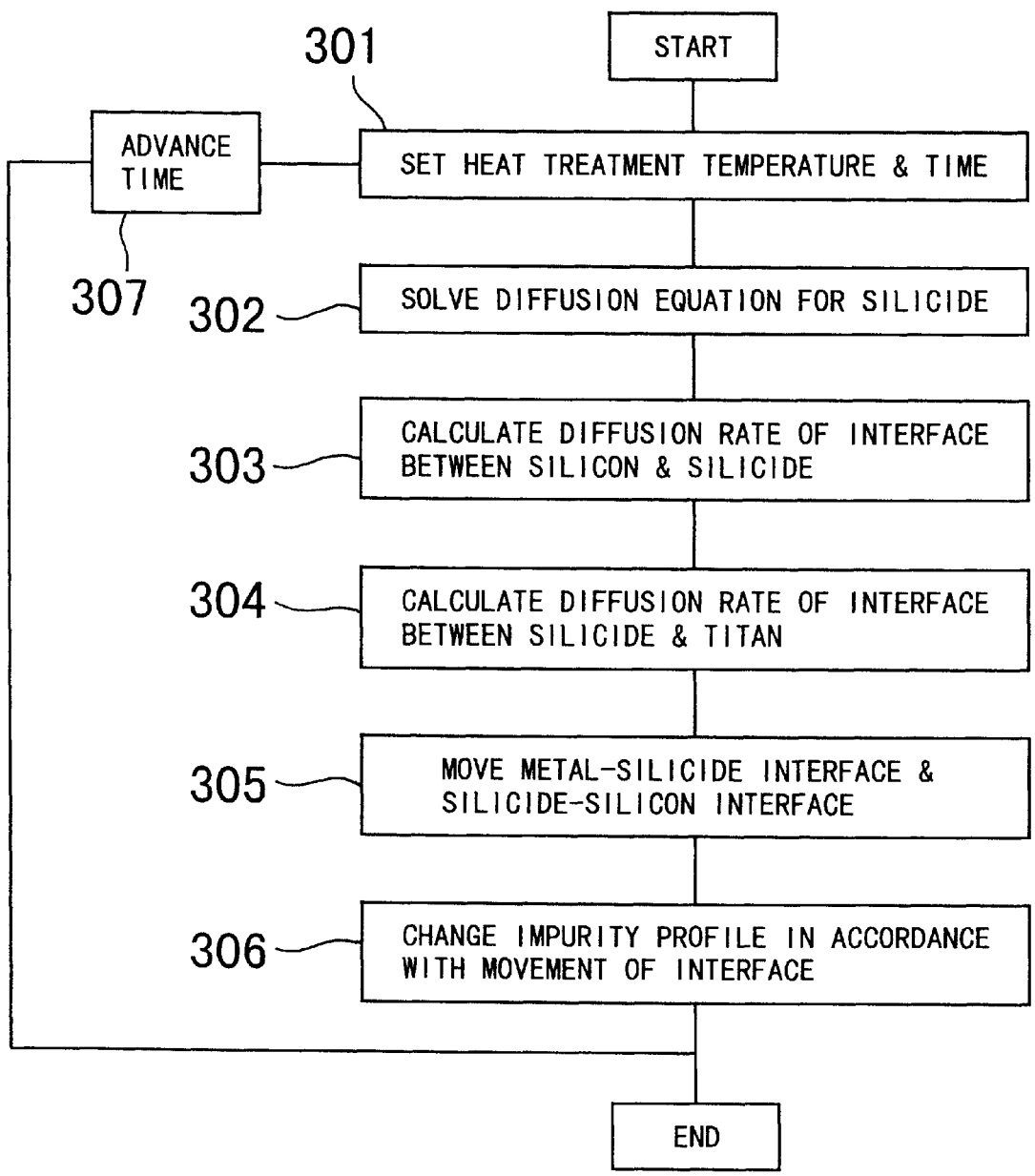
FIG. 5 is a flow chart illustrating a conventional simulation method of a silicide reaction for use with production of semiconductor devices.
Figure 6:
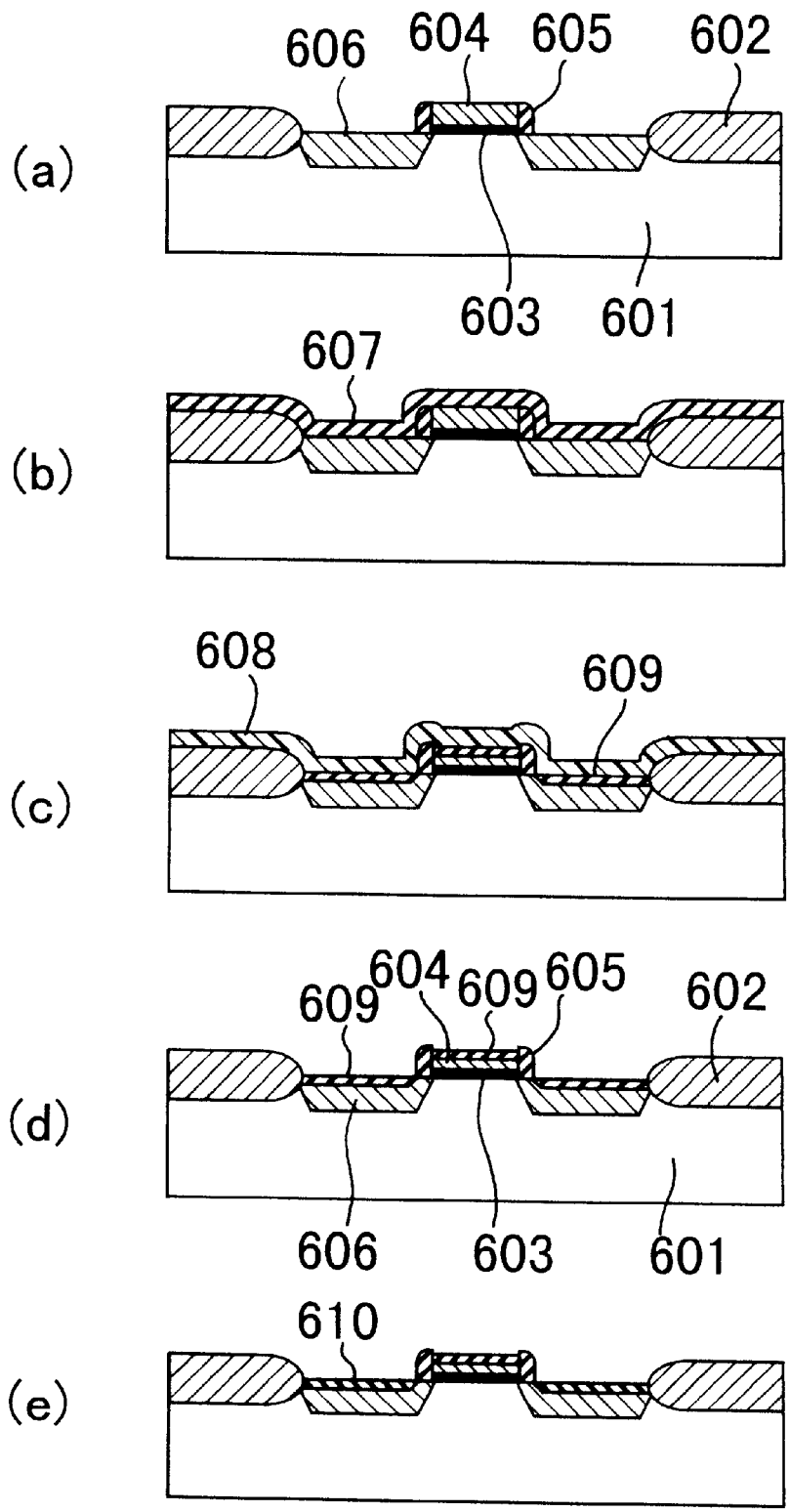
FIGS. 6(a) to 6(e) are sectional views illustrating different steps of a conventional silicide formation process.

Referring now to FIG. 4, there is illustrated in a flow chart another simulation method of a silicide reaction for use with production of semiconductor devices according to the present invention. In the method of the present embodiment, the step values calculated by calculation of the strength of materials, which are used in the method of the first embodiment described above, are used to weight another diffusion equation for a high melting point metal which is present independently of the diffusion equation for silicon for calculation of the diffusion rate of silicon. According to the present method, a phenomenon that a vacancy is formed between silicon and a metal film can be simulated.

The method of the present embodiment is similar to the method of the first embodiment in that a single beam model (expression (6)) given below of the metal strength at the interface between metal and silicon in an initial stage of a reaction is introduced into the expression of the silicon reaction rate:

$$\delta_{max} = 3Pl/2h^2 \quad (6)$$

Further, assuming that a silicide reaction requires plastic deformation of titanium, a silicide reaction acting as a load is calculated from the titanium film thickness dependency of the limit wire width, and assuming that the yield strength of titanium is $1.4 \times 10^9$ dyncm$^{-2}$ from the expression (1) and assuming that the silicide reaction force is $4 \times 10^2$ dyncm$^{-2}$, $4 \times 10^2$ dyncm$^{-2}$ is calculated as the silicide reaction force (step 203). Then, the ratio between the silicide reaction force and the titanium plastic deformation force is calculated (step 204). The steps up to this step 204 are similar to those of the method of the first embodiment described hereinabove.

Thereafter, using the ratio between the silicide reaction force and the force required for plastic deformation of titanium as a weight function, the diffusion equation of titanium of the following expression (7) is calculated (step 205):

$$\frac{\partial C_i}{\partial t} = \nabla(D(A) \cdot \nabla C_i) - R \quad (7)$$

where A is the weight function for discrimination of whether or not plastic deformation is possible.

The diffusion rate at the ith point of titanium can be calculated from the following expression (8) (step 206):

$$\frac{dX_i}{dt} = \frac{Ak_i C_i N_i}{N_i} \quad (8)$$

Thereafter, the diffusion equation for silicon is calculated independently of the calculation in step 203 in which the silicide reaction force is calculated (step 207). Furthermore, the diffusion rate of silicon is calculated (step 208). Here, a condition that, if the impurity concentration of silicon is lower than a certain fixed value such as, for example, $10^{15}$ cm$^{-2}$, a vacancy is produced is added. From the growth rate of silicide, the moving velocities of the interfaces between titanium and silicide and between silicide and silicon are calculated, and the interfaces are moved for a very short time in accordance with the moving speeds. In this stage, visco-elasticity is performed and the interfaces are deformed in profile. Then, using this result as a boundary condition, the impurity distribution in the bulk is calculated by solving the diffusion equation (step 209).

Thereafter, the processing in steps 201 to 209 described above is repeated (step 210).

The method of the second embodiment can simulate with values nearer to experiment values than the method of the first embodiment in that it can represent also the phenomenon that a vacancy is formed at the interface between titanium and silicon and stops the reaction.

Having now fully described the invention, it will be apparent to one of ordinary skill in the art that many changes and modifications can be made thereto without departing from the spirit and scope of the invention as set forth herein.

What is claimed is:

1. A computer implemented simulation method of modeling a silicide reaction for use for production of semiconductor devices, comprising the steps of:

simulating in a computer model attaching a high melting point metal having a first film thickness to a silicon layer having a first width, heat treating said high melting point metal and said silicon layer and detecting a minimum value of the first width with which a silicide reaction of the high melting point metal is not suppressed;

calculating a yield strength of said high melting point metal with said first film thickness and calculating a silicide reaction force at an interface between said high melting point metal and said silicon from said yield strength and the minimum value of the first width; and solving, when said silicide reaction force is higher than said yield strength, a diffusion equation but determining, when said silicide reaction force is lower than said yield strength, that sufficient silicification is not performed.

2. A computer implemented simulation method of modeling a silicon reaction for use for production of semiconductor devices as claimed in claim 1, wherein the diffusion equation is a diffusion equation for silicide.

3. A computer implemented simulation method of modeling a silicon reaction for use for production of semiconductor devices as claimed in claim 1, wherein said steps of simulating, calculating and solving are successively and repeatably performed.

4. A computer implemented simulation method of modeling a silicon reaction for use for production of semiconductor devices as claimed in claim 1, wherein a ratio between said silicide reaction force and said yield strength is applied as a weight function to said diffusion equation.

5. A computer implemented simulation method of modeling a silicon reaction for use for production of semiconductor devices as claimed in claim 1, wherein said diffusion equation includes a diffusion equation for said high melting point metal and another equation for the silicon, and said diffusion equation for said high melting point metal is solved first and then said diffusion equation for the silicon is solved.

6. A computer implemented simulation method of modeling a silicon reaction for use for production of semiconductor devices as claimed in claim 1, wherein said diffusion equation is a diffusion equation for said high melting point metal, and further comprising the step of solving, after said diffusion equation for said high melting point metal is solved, another diffusion equation for the silicon obtained independently of the diffusion equation for the high melting point metal.

* * * * *